(12) United States Patent
Bean et al.

(10) Patent No.: US 11,621,219 B2
(45) Date of Patent: Apr. 4, 2023

(54) METHOD AND APPARATUS FOR THROUGH SILICON DIE LEVEL INTERCONNECT

(71) Applicant: Rockwell Collins, Inc., Cedar Rapids, IA (US)

(72) Inventors: Reginald D. Bean, Center Point, IA (US); Bret W. Simon, West Liberty, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 112 days.

(21) Appl. No.: 17/178,971

(22) Filed: Feb. 18, 2021

(65) Prior Publication Data
US 2022/0262715 A1 Aug. 18, 2022

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 23/49827* (2013.01);
(Continued)

(58) Field of Classification Search
CPC ......... H01L 23/49838; H01L 23/49827; H01L 21/486
See application file for complete search history.

(56) References Cited

U.S. PATENT DOCUMENTS

| 7,683,459 B2 | 3/2010 | Ma et al. |
| 8,097,964 B2 | 1/2012 | West et al. |
| (Continued) | | |

FOREIGN PATENT DOCUMENTS

| CN | 109522649 A | 3/2019 |
| CN | 110620097 A | 12/2019 |
| (Continued) | | |

OTHER PUBLICATIONS

Burkett et al., Manuscript entitled "Tutorial on Forming Through-Silicon Vias", Journal of Vacuum Science and Technology A, Apr. 14, 2020.

*Primary Examiner* — Dale E Page
*Assistant Examiner* — Wilner Jean Baptiste
(74) *Attorney, Agent, or Firm* — Suiter Swantz pc llo

(57) ABSTRACT

An electronic assembly is disclosed. The electronic assembly includes a primary die, comprising a bulk layer, an integrated circuitry layer, a metal layer, a first redistribution layer, and a first attachment layer. The primary die further includes at least one aligned through-hole in the bulk layer and integrated circuitry layer. The electronic assembly further includes a secondary die physically coupled to the primary die via a second attachment layer. The electronic assembly further includes an interconnect header that includes plurality of interconnect filaments configured to electrically couple the first redistribution layer to one of the at least one metal layer via the at least one bulk layer through-hole and the at least one integrated circuitry through-hole. The interconnect header is generated by applying an electrically conductive filaments on a plurality of wafers, thinning the wafers, stacking and attaching the wafers into a wafer stack, and dicing the wafer stack.

8 Claims, 13 Drawing Sheets

(51) Int. Cl.
*H01L 23/00* (2006.01)
*H01L 25/00* (2006.01)
*H01L 25/065* (2023.01)

(52) U.S. Cl.
CPC .............. *H01L 24/16* (2013.01); *H01L 24/24* (2013.01); *H01L 24/48* (2013.01); *H01L 24/73* (2013.01); *H01L 24/81* (2013.01); *H01L 24/82* (2013.01); *H01L 24/85* (2013.01); *H01L 24/91* (2013.01); *H01L 24/94* (2013.01); *H01L 25/0657* (2013.01); *H01L 25/50* (2013.01); H01L 2224/16145 (2013.01); H01L 2224/24147 (2013.01); H01L 2224/48145 (2013.01); H01L 2224/73209 (2013.01); H01L 2224/73227 (2013.01); H01L 2224/81203 (2013.01); H01L 2224/82203 (2013.01); H01L 2224/85203 (2013.01)

(56) References Cited

U.S. PATENT DOCUMENTS

| | | | |
|---|---|---|---|
| 9,040,412 | B2 | 5/2015 | Ma et al. |
| 9,054,081 | B2 | 6/2015 | Nakamura et al. |
| 9,960,146 | B1 | 5/2018 | Lin |
| 10,090,231 | B2 | 10/2018 | Uzoh et al. |
| 10,727,203 | B1 | 7/2020 | Bean et al. |
| 2016/0254249 | A1* | 9/2016 | Jeng .................. H01L 23/49827 257/692 |
| 2020/0066640 | A1 | 2/2020 | Sarkar et al. |
| 2020/0203224 | A1 | 6/2020 | Hiblot et al. |
| 2020/0312714 | A1 | 10/2020 | Kirby et al. |

FOREIGN PATENT DOCUMENTS

CN 110323218 B 11/2020
WO 2009146587 A1 12/2009

\* cited by examiner

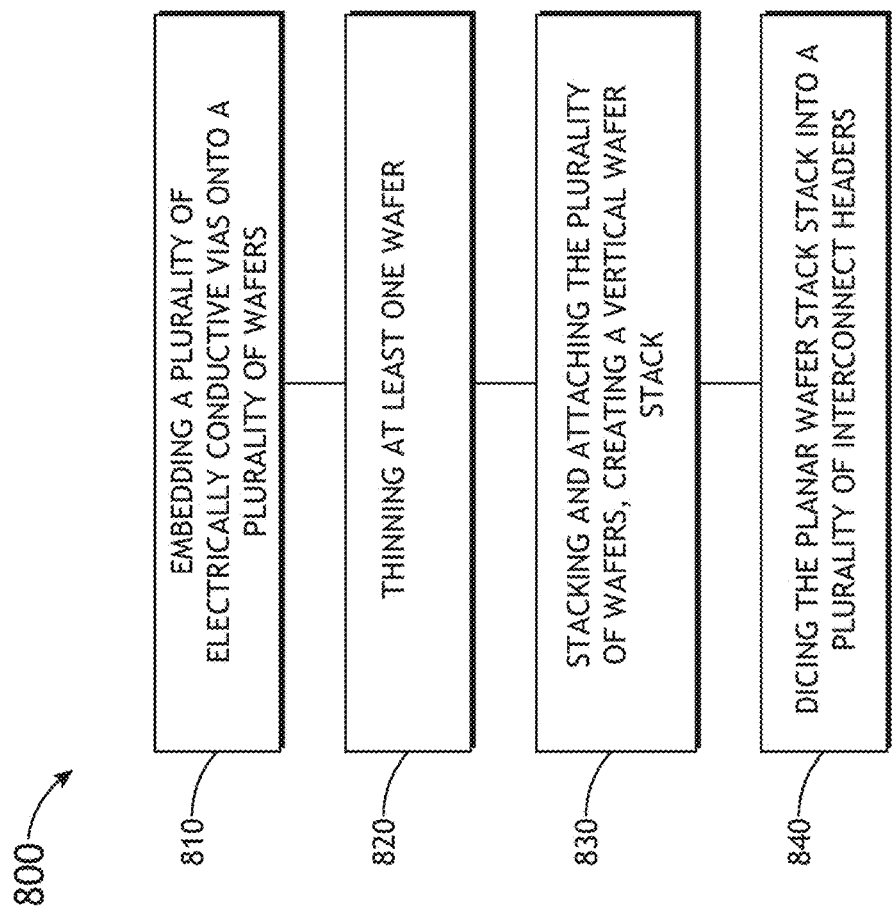

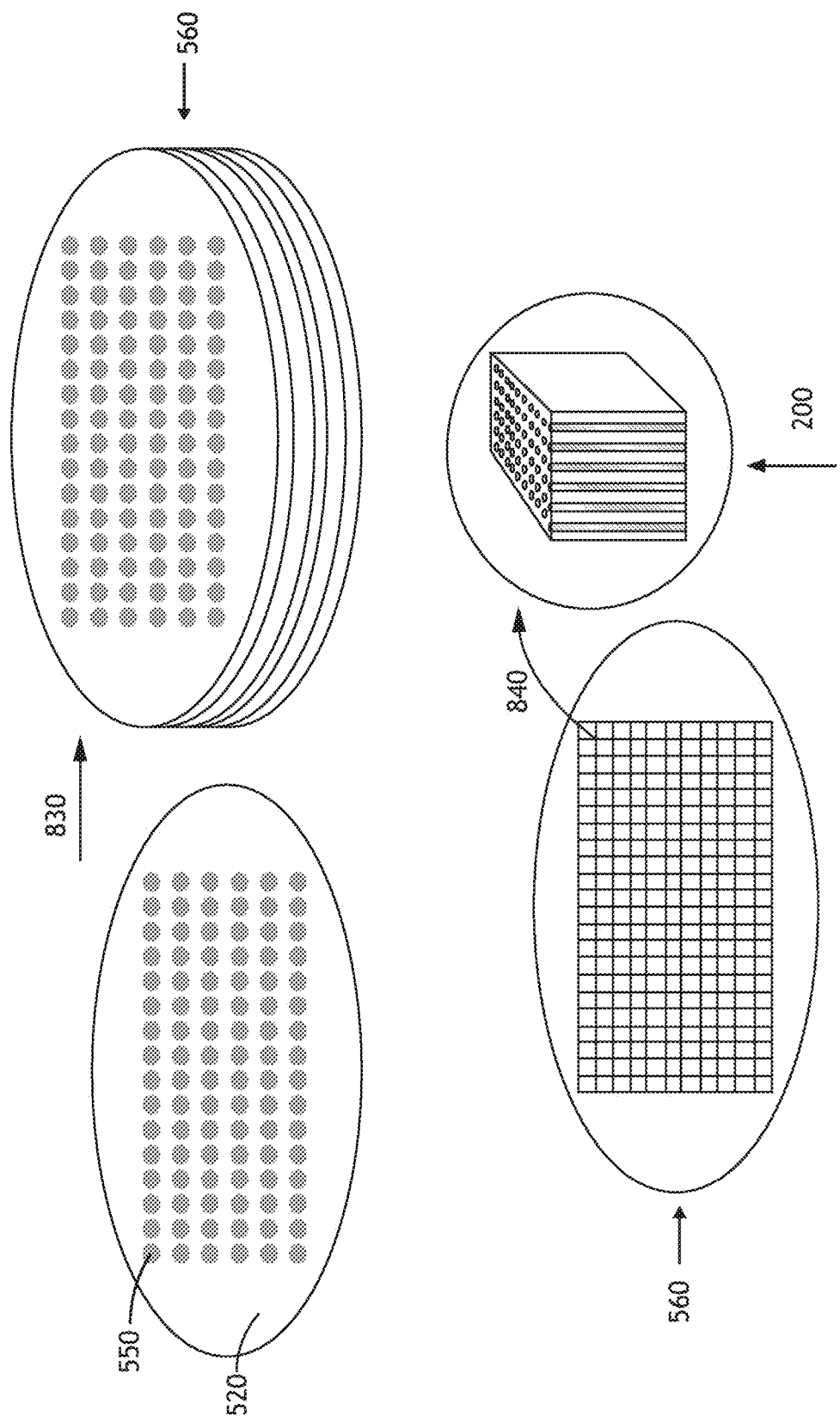

US 11,621,219 B2

METHOD AND APPARATUS FOR THROUGH SILICON DIE LEVEL INTERCONNECT

BACKGROUND

Integrated circuit designs are typically under constant revision to reduce their footprint within computing systems. At the same time, logic densities within integrated circuits have increased to accommodate the growing need for higher processing performance. To minimize circuit board area consumed, integrated circuit dies may be stacked in microelectronics packages. This stacking has created a need for interconnects through the bulk silicon side of integrated circuits, connecting the metal layers on the front side to an integrated circuit attachment layer on the backside. Through-silicon vias (TSVs) have been developed to establish these interconnects.

Unfortunately, TSVs are difficult to manufacture due to process variations at the integrated circuit manufacturing foundry. In some instances, TSVs may not be available due to manufacturing delays or cost constraints.

Interconnects may also be wrapped around the perimeter of the chip using wire bonds or other perimeter located vertical interconnect. However, these interconnects lengthen interconnect distances, and increase labor and costs for building the package.

Accordingly, it is desirable to provide a system that avoids the shortcomings of conventional approaches.

SUMMARY

A system is disclosed. In one or more embodiments, the system includes an electronic assembly. In one or more embodiments, the electronic assembly includes a primary die. In one or more embodiments, the primary die includes a bulk layer within which at least one bulk layer through-hole has been integrated. In one or more embodiments, the primary die further includes an integrated circuitry layer disposed on a first side of the bulk layer, wherein the integrated circuitry layer comprises at least one integrated circuitry through-hole that has been integrated configured to align with the at least one bulk layer through-hole. In one or more embodiments, the primary die further includes at least one metal layer. In one or more embodiments, the primary die further includes a first redistribution layer. In one or more embodiments, the electronic assembly further includes a secondary die physically coupled to the primary die. In one or more embodiments, the secondary die includes a second attachment layer configured to attach to the first redistribution layer. In one or more embodiments, the electronic assembly further includes an interconnect header that includes a plurality of interconnect filaments configured to electrically couple the first redistribution layer to one of the at least one metal layer via the at least one bulk layer through-hole and the at least one integrated circuitry through-hole.

In some embodiments of the system, the system further includes a second redistribution layer disposed between the metal layer and the first attachment layer, wherein metal layer comprises at least one metal layer through-hole configured to align with the at least one bulk layer through-hole and the at least one integrated circuitry through-hole, wherein the interconnect header is configured to electrically couple to the first redistribution layer and the second redistribution layer via the at least one bulk layer through-hole, the at least one integrated circuitry through-hole, and the at least one metal layer through hole.

In some embodiments of the system, the interconnect filaments are configured as an array.

In some embodiments of the system, the interconnect header is generated. In some embodiments, the generation of the interconnect header includes applying a plurality of electrically conductive filaments onto a plurality of wafers. In some embodiments, the generation of the interconnect header includes thinning at least one wafer of the plurality of wafers. In some embodiments, the generation of the interconnect header includes stacking and attaching the plurality of wafers, creating a planar wafer stack. In some embodiments, the generation of the interconnect header includes dicing the planar wafer stack into a plurality of interconnect headers.

In some embodiments of the system, the interconnect header is generated. In some embodiments, the generation of the interconnect header includes applying a plurality of electrically conductive vias onto a plurality of wafers. In some embodiments, the generation of the interconnect header includes thinning at least one layer of the plurality of wafers. In some embodiments, the generation of the interconnect header includes stacking and attaching the plurality of wafers, creating a vertical wafer stack. In some embodiments, the interconnect header includes dicing the vertical wafer stack into a plurality of interconnect headers.

In some embodiments of the system, at least one of the primary die or the secondary die is configured for flip chip mounting.

In some embodiments of the system, at least one of the first attachment layer or the second attachment layer comprises at least one of solder balls, wire-bonding, or ball bumps.

In some embodiments of the system, the interconnect header is attached on at least one end to the primary die via a thermal compression bond.

A method is disclosed. In some embodiments the method includes generating a primary die cavity within a primary die. In some embodiments, the method further includes fixing an interconnect header within the primary die cavity. In some embodiments, the method further includes attaching a first redistribution layer to the primary die, wherein the first redistribution layer electrically couples to a first end of the interconnect header. In some embodiments, the method further includes attaching a secondary die to the primary die to a second end of the first redistribution layer.

In some embodiments of the method, the method further includes attaching a second redistribution layer to the primary die, wherein the first redistribution layer and the second redistribution layer are electrically coupled via the interconnect header.

In some embodiments of the method, the interconnect header is generated. In some embodiments, the generation of the interconnect header includes applying a plurality of electrically conductive filaments onto a plurality of wafers. In some embodiments, the generation of the interconnect header further includes thinning at least one wafer, of the plurality of wafers. In some embodiments, the generation of the interconnect header further includes stacking and attaching the plurality of wafers, creating a planar wafer stack. In some embodiments, the generation of the interconnect header further includes dicing the planar wafer stack into a plurality of interconnect headers.

In some embodiments of the method, the interconnect header is generated. In some embodiments the generation of the interconnect header includes applying a plurality of electrically conductive vias onto a plurality of wafers. In some embodiments the generation of the interconnect header further includes thinning at least one wafer of the plurality of wafers. In some embodiments the generation of the interconnect header further includes stacking and attaching the plurality of wafers, creating a vertical wafer stack. In some embodiments the generation of the interconnect header further includes dicing the vertical wafer stack into a plurality of interconnect headers.

In some embodiments of the method, the interconnect header is comprised as interconnect filaments, wherein the interconnect filaments are configured as an array.

In some embodiments of the method, at least one of the primary die or the secondary die is configured for flip chip mounting.

In some embodiments of the method, at least one of the first attachment layer or the second attachment layer comprises at least one of solder balls, wire-bonding, or ball bumps.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

FIG. 8A is a flow chart illustrating a method for creating an interconnect header 200, in accordance with one or more embodiments of this disclosure;

FIG. 8B is a diagram illustrating the process of fabrication as disclosed in the method, in accordance with one or more embodiments of this disclosure.

DETAILED DESCRIPTION

Figure 1:
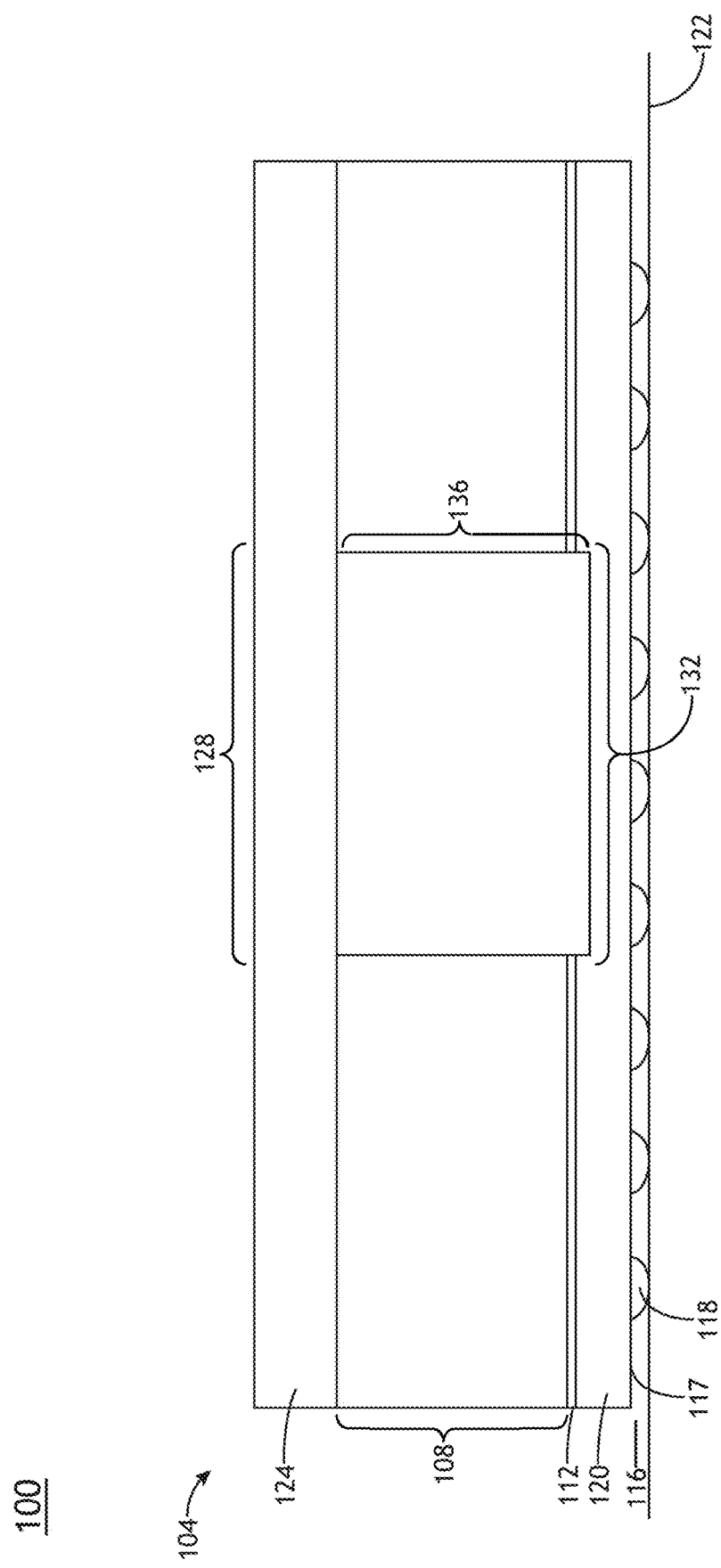
FIG. 1 is a diagram illustrating a side cutaway view of an electronic assembly in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

Broadly, embodiments of the disclosure include a system containing an electronic assembly that includes multiple stacked dies. In particular, the electronic assembly includes at least a primary die and a secondary die electrically coupled via a header interconnect that is positioned within a primary die through-hole or cavity. The header interconnect may be created through methods and tools utilized by a typical semiconductor foundry, requiring less complicated methods and tools required for generating TSVs.

FIG. 1 is a diagram illustrating a side cutaway view of an electronic assembly 100 in accordance with one or more embodiments of this disclosure. In one or more embodiments, the electronic assembly includes a primary die 104. The primary die 104 may include any type of semiconductor die or any type of integrated circuit including but not limited to a central processing unit die, an application-specific integrated circuit die, a field-programmable gate array die, a processing circuit die, a EEPROM die, or a non-volatile memory die. The primary die 100 may also be configured as a commercial-off-the-shelf (COTS) die or a trusted foundry die.

The primary die 104 includes a bulk layer 108 that includes semiconductor substrate material (e.g., silicon or germanium). The primary die 104 further includes an integrated circuitry layer 112 configured with electronic circuitry (e.g., transistors). The primary die 104 further includes a first attachment layer 116. The first attachment layer 116 provides a physical coupling and/or an electrical coupling between the primary die 104 and other components within the electronic assembly 100 or other electronic substrates 122 (e.g., the first attachment layer 116 attaches to a first attachment surface 117 of the primary die 104). For example, the first attachment layer 116 may be configured for flip-chip mounting. For instance, the first attachment layer 116 may comprise individual solder bumps 118 attached to individual chip pads or other metal substrate (e.g., one or more metal layers 120) disposed on the primary die 104, electrically coupling the primary die 104 to the electronic substrate 122. The first attachment layer 116 may be configured for any type of electrical and/or physical bonding of the primary die 104 to an electronic substrate 122 (e.g., wire-bonding, solder balls, or ball bumps). Therefore, the above description should not be interpreted as a limitation of the present disclosure, but merely as an illustration.

The electronic substrate 122 may include any electronic componentry that is configured to be physically and electrically coupled to the primary die 104 including but not limited to printed circuit boards (PCB), printed writing boards (PWB), and semiconductor dies. For example, the electronic substrate 122 may be configured as an application-specific integrated circuit (ASIC) that is bonded to the primary die 104 as part of a multi-chip module (MCM). In another example, the electronic substrate may be configured as a single sided PCB.

In embodiments, the primary die 104 includes a first redistribution layer 124 attached to the bulk layer 108 side of the primary die. The first redistribution layer is configured to enable electric coupling between electronic assembly 100 and additional electronic components attached to the electronic substrate 122. The first redistribution layer 124 may also enhance physical coupling of the primary die 104 with other componentry attached to the outer surface of redistribution layer 124.

In embodiments, the primary die 104 includes one or more bulk layer through-holes 128. The primary die 104 may also include one or more extension through-holes 132 extending through the integrated circuitry layer 112, and may extend through one or more metal layers within the metal layer within metal layers 120. For example, the one or more bulk-layer through-holes 128 and one or more extension through-holes 132 may be aligned and configured as a primary die cavity 136. The primary die cavity 136 may further extend into and/or through the metal layer 120, the first attachment layer 116, and/or the redistribution layer 124.

Figure 2:
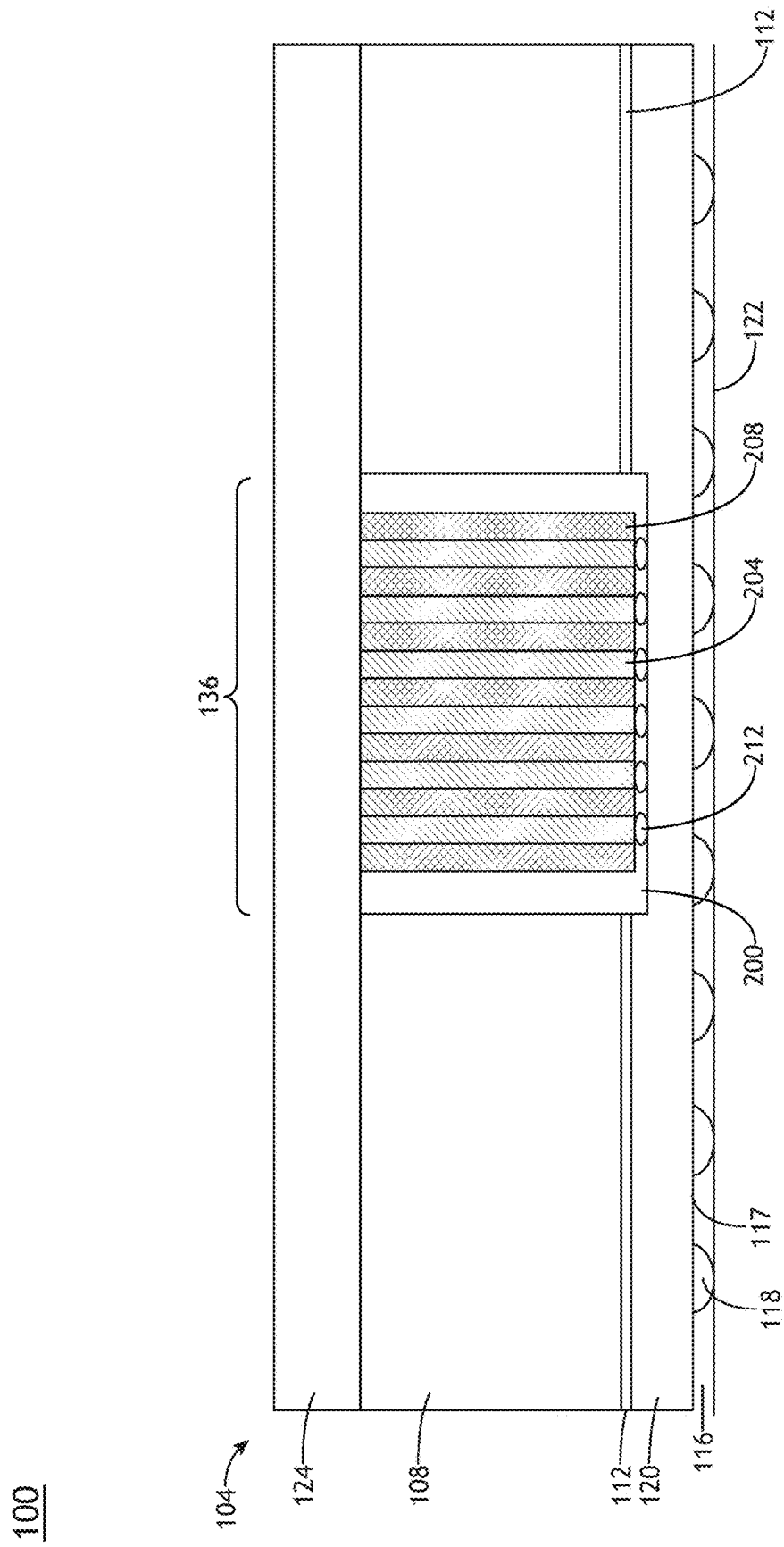
FIG. 2 is a diagram illustrating a close-up side cutaway view of the primary die in accordance with one or more embodiments of this disclosure.

FIG. 2 is a diagram illustrating a close-up side cutaway view of the primary die 104 in accordance with one or more embodiments of this disclosure. In some embodiments, the primary die includes an interconnect header 200, configured as a fine pitch interconnect, inserted into the primary die cavity 136. The interconnect header 200 is configured to include one or more interconnect filaments 204 (e.g., conductors) configured to electrically couple components within the electronic assembly 100. For example, the interconnect header 200 may be configured to electrically couple any two conductive layers within the electronic assembly 100. For instance, the interconnect header 200 may be configured to electrically couple the first redistribution layer 124 to the first metal layer within metal layers 120. The interconnect header 200 further includes a header non-conductor 208 configured to stabilize the spacing of the interconnect filaments 204. The header non-conductor 208 may be configured to include any non-electrically conductive material configured to physically stabilize the interconnect filaments 204 including but not limited to silicon, plastic, and/or ceramic.

In some embodiments, the interconnect header 200 is configured with no active logic and may be fabricated independently of some or all aspects of the fabrication of the primary die 104. For example, the interconnect header may be formed separately from the primary die 104, then installed into the primary die cavity 136 late in the primary die 104 fabrication process, but before the first redistribution layer 124 is formed. The interconnect header 200 may be attached to the primary die 104 by any method including but not limited to thermal compression bond bonding. For example, the interconnect header may be attached to the first metal layer within metal layers 120, the first distribution layer 124 and/or any other layer via thermal compression bonding, with cavity voids filled. The interconnect header 200 may form one or more functions similar to a through-silicon via.

The interconnect header 200 may be configured to electrically couple any layer or component within the electronic assembly. For example, the interconnect header 200 may be electrically coupled on one end to the first redistribution layer 124 and to a metal layer 120 on the other end. For instance, the interconnect header 200 may be electrically coupled to the metal layer 120 via header attach points 212. In this manner the first redistribution layer 124 may be configured to electrically communicate with the metal layer 120 and or first attachment layer 116 without electrically communicating with the integrated circuitry layer 112.

Figure 3:
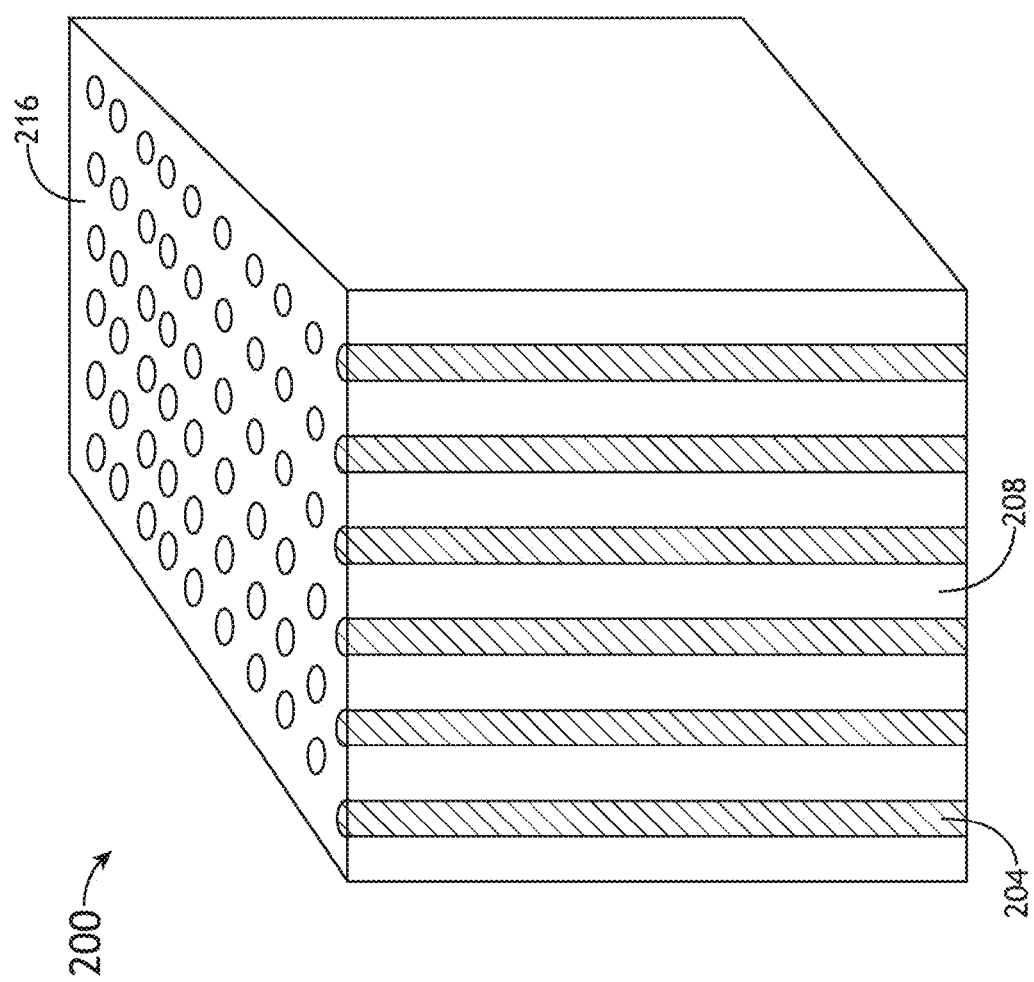
FIG. 3 is a diagram illustrating a perspective view of the interconnect header, in accordance with one or more embodiments of this disclosure.

FIG. 3 is a diagram illustrating a perspective view of the interconnect header 200, in accordance with one or more embodiments of this disclosure. The interconnect header 200 may be configured as any size, shape, or number of interconnect filaments 204. The interconnect header 200 may be configured with any pattern of interconnect filaments 204 interspersed within the header matrix 208 (e.g., as viewed from an end side 216 of the interconnect header 200). For example, the interconnect filaments 204 may be configured as a square array (e.g., as in FIG. 3). In another example, the interconnect filaments 204 may be configured as a triangle, or otherwise polygonal pattern array. In another example, the interconnect filaments 204 filaments 204 may be configured with a seemingly random distribution, with placement of the individual interconnect filaments 204 specifically designed for connections with specific header attach points 212.

It is noted that the interconnect header 200 may be configured with one or more functions that are similar to one or more functions of a TSV. However, interconnect header 200 is a modular component within the electronic assembly 100, requiring considerably less time and cost for through-die connections. For example, creation of a TSV on a semiconductor die may require the steps of via formation, insulation/ barrier deposition, seed deposition, copper plating, carrier removal, back side processing, thinning, and wafer attachment. A tutorial for TSV formation is described by Burkett et al., in a manuscript entitled "Tutorial on Forming Through-Silicon Vias" published in the Journal of Vacuum Science and Technology A, Apr. 14, 2020, which is incorporated by reference in its entirety.

Figure 4A:
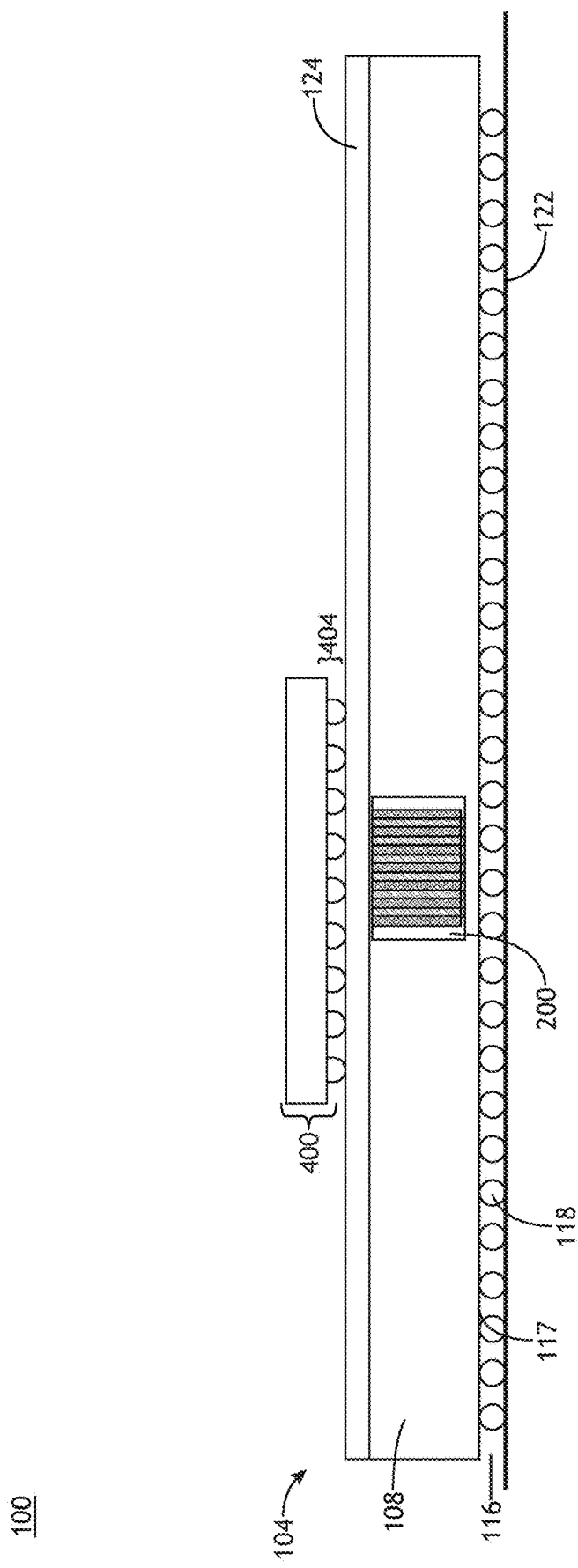
FIG. 4A is a diagram illustrating a side cutaway view of an electronic assembly in accordance with one or more embodiments of this disclosure.

FIG. 4A is a diagram illustrating a side cutaway view of an electronic assembly 100 in accordance with one or more embodiments of this disclosure. In embodiments, the electronic assembly 100 further includes a secondary die 400. The secondary die 400 may include any type of semiconductor die or any type of integrated circuit including but not limited to a central processing unit die, an application-specific integrated circuit die, a field-programmable gate array die, a processing circuit die, or a EEPROM die or other non-volatile memory die. The secondary die 400 may also be configured as a commercial-off-the-shelf (COTS) die or a trusted foundry die. The electronic assembly 100 may be configured with any number of secondary dies 400.

In embodiments, the one or more secondary dies 400 is physically coupled to the primary die 104 via a second attachment layer 404. The second attachment layer 404 provides a physical coupling and/or an electrical coupling between the secondary die 400 and other components within the electronic assembly 100 or other electronic substates (e.g., printed circuit boards (PCB) or printed wiring boards (PWB)). For example, the second attachment layer 404 may be configured for flip-chip bonding. For instance, the second attachment layer 404 may comprise individual solder bumps (e.g., as in FIG. 4A and 4B) configured to bind to the first redistribution layer 124, electrically coupling the second attachment layer 404 to the first redistribution layer 124 and physically coupling the secondary die 400 to the primary die 104. The second attachment layer 404 may be configured for any type of physical and/or electrical bonding of the secondary die 400 to the primary die 104 (e.g., wire-bonding, solder balls, or ball bumps). Therefore, the above description should not be interpreted as a limitation of the present disclosure, but merely as an illustration.

In some embodiments, one or more secondary dies 400 are electrically coupled to the electronic substrate 122 via the interconnect header 200. For example, an electric pulse transmitted from secondary die may travel from the second attachment layer 404 (e.g., one or more solder ball of the second attachment layer 404) to one or more electrical paths on the first redistribution layer 124. The electric pulse may then travel from an output path on the first redistribution layer 124 to one or more connection filaments 204 on the interconnect header. The electrical pulse may then travel through the one or more connection filaments 204 to one or more electrical paths on the metal layer 120 (e.g., via the one or more header attach points 212. The electrical pulse may then travel from the metal layer 120 through the first attachment layer 116 (e.g., via one or more solder bumps 118), onto the circuitry of the electronic substrate 122. Correspondingly, an electric pulse may originate from the electronic substrate 122 and travel to the one or more secondary dies 400 via a similar pathway. In this manner, signals from the one or more secondary dies 400 may electrically couple with the secondary substrate 122 without interaction with the integrated circuitry layer 112 of the primary die 104.

Figure 4B:
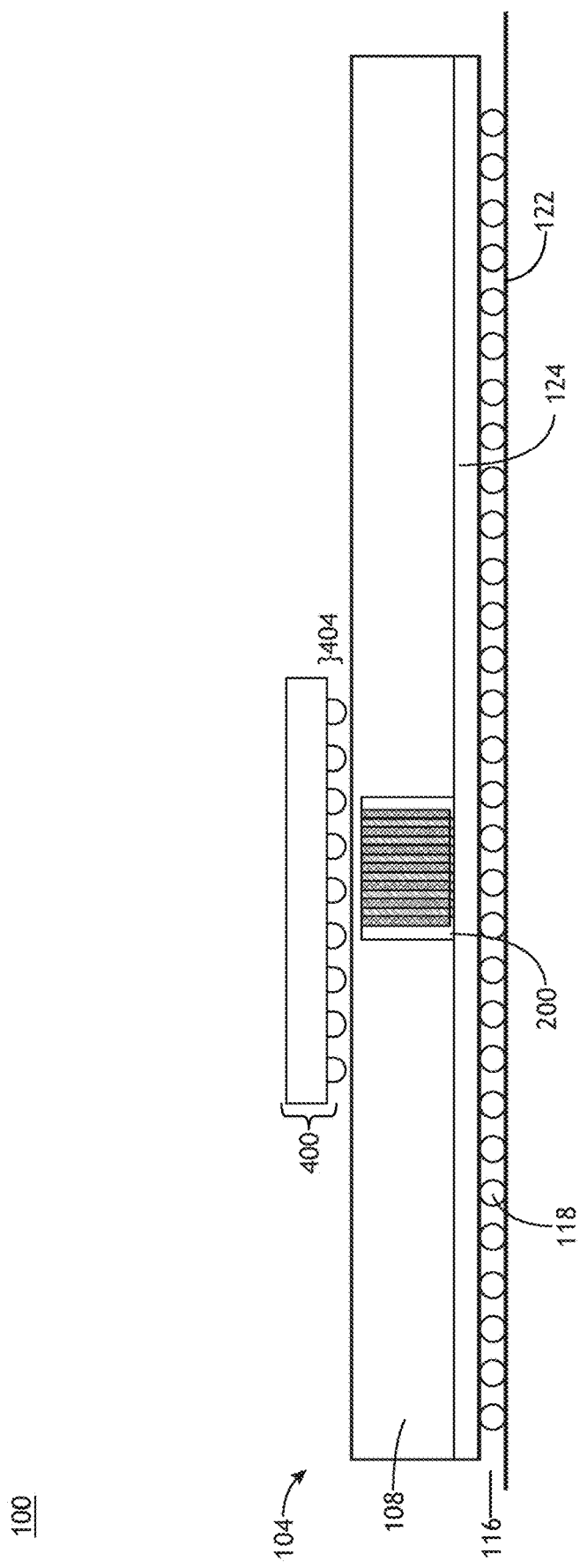
FIG. 4B is a diagram illustrating a side cutaway view of an electronic assembly in accordance with one or more embodiments of this disclosure.

In some embodiments, the orientation of the primary die 104 (e.g., the bulk layer 108, first distribution layer 124, and the interconnect header 200) is flipped, as shown in FIG. 4B. The flipped orientation of the primary die 104 permits the backside of the primary die 104 to attached to the electronic substrate 122 via solder bumps 118.

Figure 5:
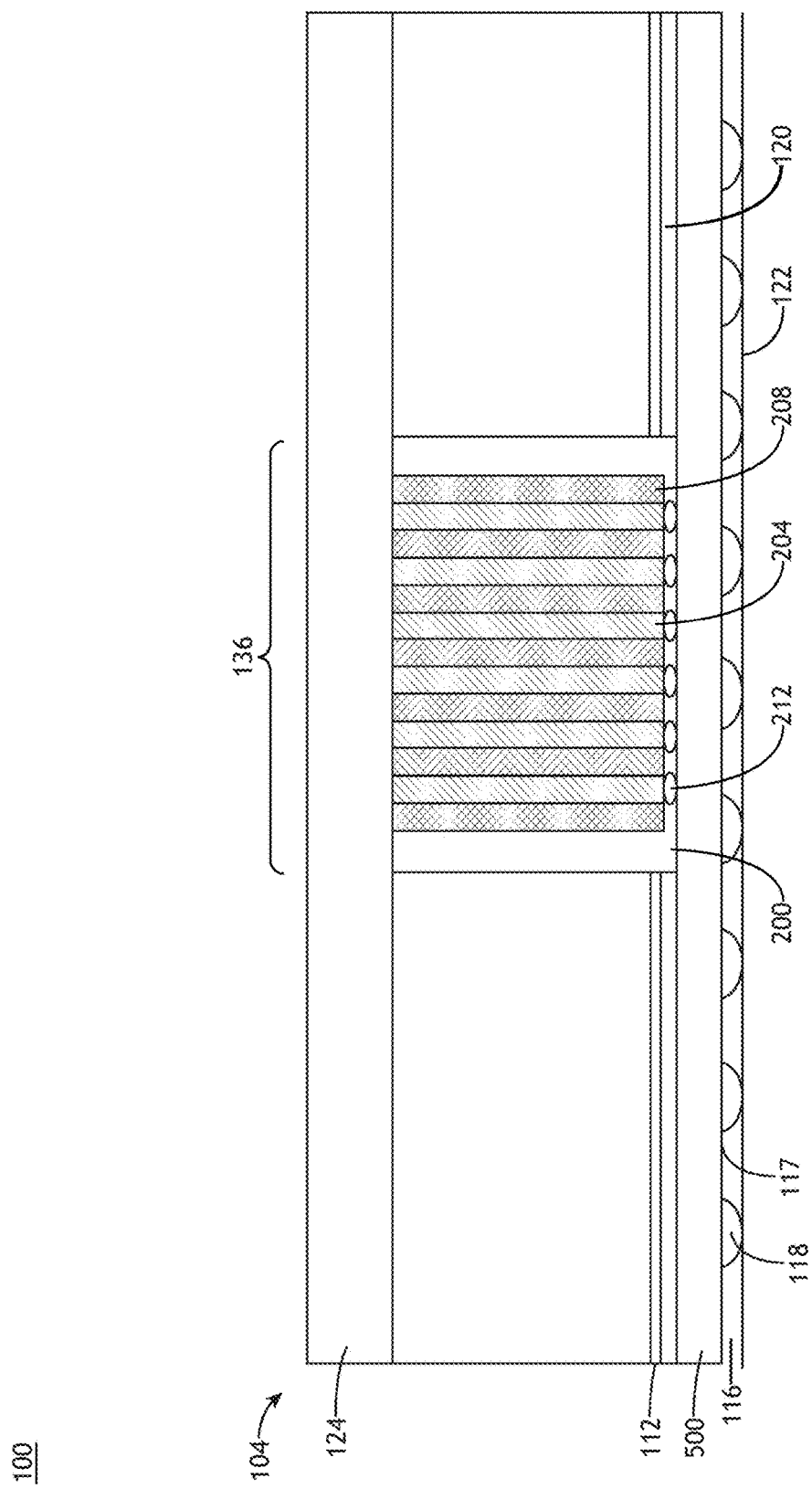
FIG. 5 is a diagram illustrating a side cutaway view of an electronic assembly in accordance with one or more embodiments of this disclosure.

FIG. 5 is a diagram illustrating a side cutaway view of an electronic assembly 100 in accordance with one or more embodiments of this disclosure. In some embodiments, the primary die 104 further includes a second redistribution layer 500 disposed upon the metal layer 120 and electrically coupled to both the first attachment layer 116 and the interconnection header 200 (e.g., the interconnection header 200 is coupled on both ends by redistribution layers: the first redistribution layer 124 and the second redistribution layer 500). For example, the header attach points 212 may physically couple the interconnection header 200 to the second redistribution layer. The second redistribution layer 500 organizes the input/output of signals between the interconnection header 200 and the first attachment layer 116 (e.g., via the first attachment surface 117). For example, the second redistribution layer 500 organizes the input/output of signals between the solder bumps 118 and the first attachment surface 117. Additionally, the second redistribution layer 500 organizes the input/output of signals between the interconnection header 200 and the first attachment layer 116.

The interconnect header 200 may be configured as any type of via within the electronic package. For example, the interconnect header 200 may be configured as a through-hole via, projecting through the entirety of the primary die 104. In another example, the interconnect header 200 may be configured as a blind via. For instance, the interconnect header 200 may be configured having one end exposed from an outer surface of the primary die 104. In another example, the interconnect header 200 may be configured as a blind interconnect header, such as the interconnect header 200 shown in FIG. 5.

Figure 6A:
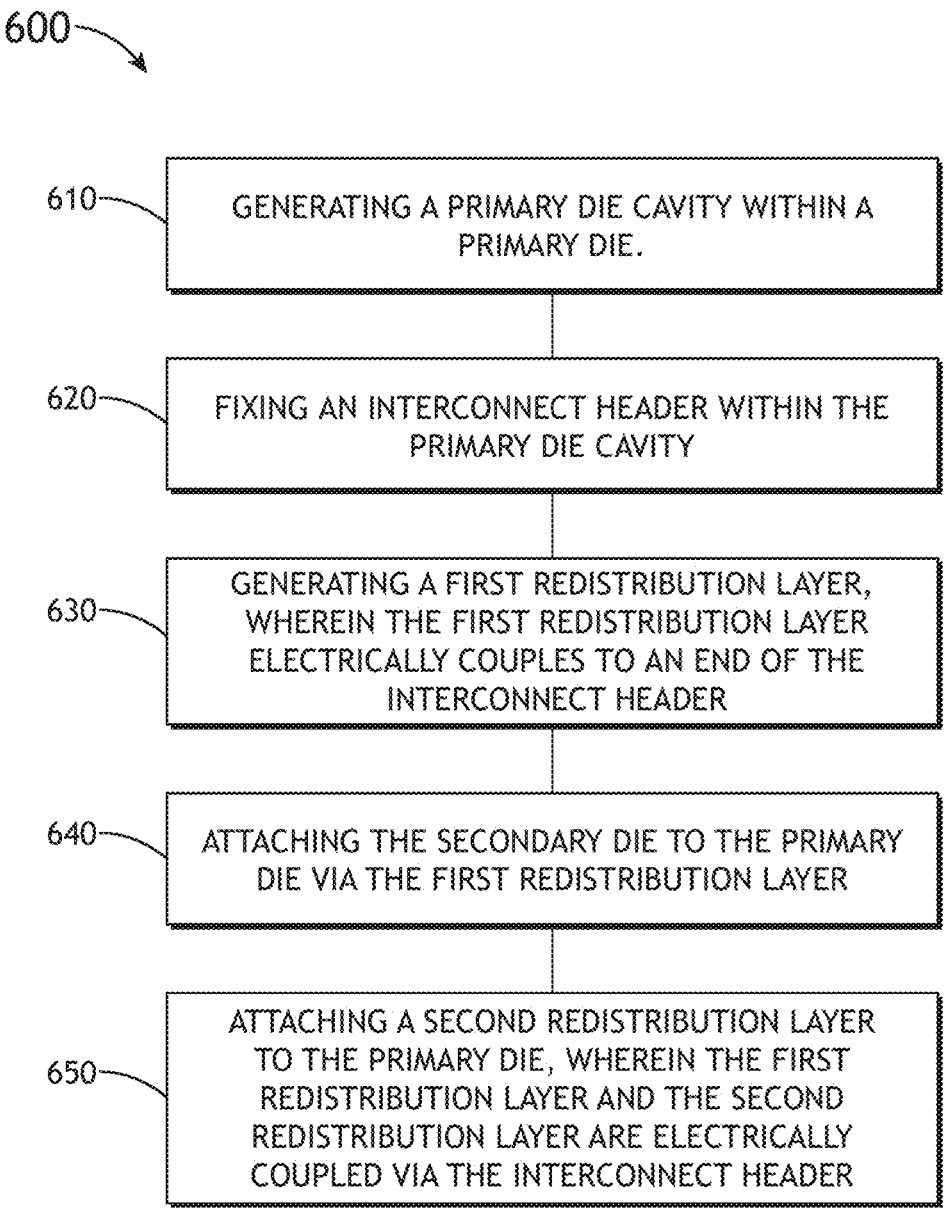
FIG. 6A is a flow chart illustrating a method for forming the electronic assembly, in accordance with one or more embodiments of this disclosure.

FIG. 6A is a flow chart illustrating a method 600 for forming the electronic assembly 100, in accordance with one or more embodiments of this disclosure. In embodiments, the method 600 includes a step 610 of generating the primary die cavity 136 within the primary die 104. The primary die cavity 136 may be performed via any method known, including but not limited to drilling, milling, and etching. For example, the primary die cavity 136 may be generated by drilling through the bulk layer 108, the integrated circuitry layer 112, and/or the metal layer 120 in a single action (e.g., soon after the wafer is fabricated). The area of the primary die 104 that is drilled may be designed so as to be void of any transistors and/or metal interconnect. In another example, the primary die cavity is formed before the formation of one or more layers of the primary die (e.g., the integrated circuitry layer and/or metal layer 120).

In some embodiments, the method 600 includes a step of 620 of fixing the interconnect header 200 within the primary die cavity 136. The interconnect header 200 may be placed (e.g., fixed) within the primary die cavity 136 using any method. For example, the interconnect header 200 may be fixed within the primary die cavity 136 by adhesive filling in the voids between the interconnect header 200 and the sides of the primary die cavity 136.

In some embodiments, the method 600 includes a step 630 of attaching a first redistribution layer 124 to the primary die, wherein the first redistribution layer 124 is electrically coupled to an end of the interconnect header 200 (e.g., either end that can be used to transmit an electric signal). The first redistribution layer 124 may be generated using any method known including photolithography, imprint lithography, etching, and passivation-based methods. The surface of the primary die 104 and/or interconnect header 200 may be modified prior to the application of the first redistribution layer 124. For example, the attachment site of the first redistribution layer 124 (e.g., the bulk layer 108 side) may be planarized. In another example, the interconnect header 200 may be surfaced so that the interconnect header 200 has the same z-height as the walls of the primary die cavity (e.g., the electrically coupling end of the interconnect header 200 and the attachment site of first redistribution layer 125 having the same plane. The first redistribution layer 124 may provide a fan out from the interconnect header, providing an attachment pattern for the secondary die 400.

Figure 6B:
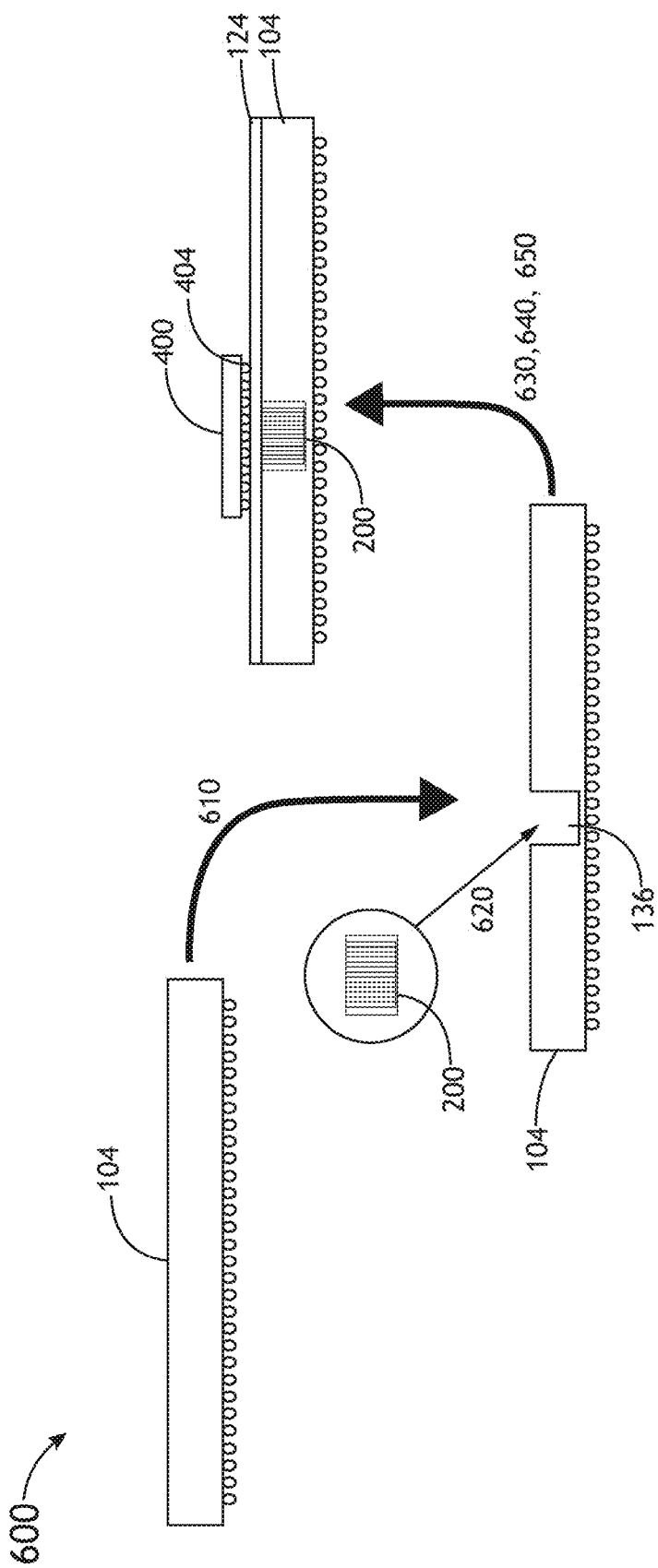
FIG. 6B is a diagram illustrating the method for forming the electronic assembly, in accordance with one or more embodiments of this disclosure.

In some embodiments, the method 600 includes a step 640 of attaching the secondary die 400 to the primary die 104 via the first redistribution layer 124. For example, the second attachment layer 404 may be comprised of solder balls that, when attached to the first redistribution layer 124, electrically couple the circuitry of the secondary die 400 to the interconnect header 200. The method 600 is further depicted in FIG. 6B.

Figure 6C:
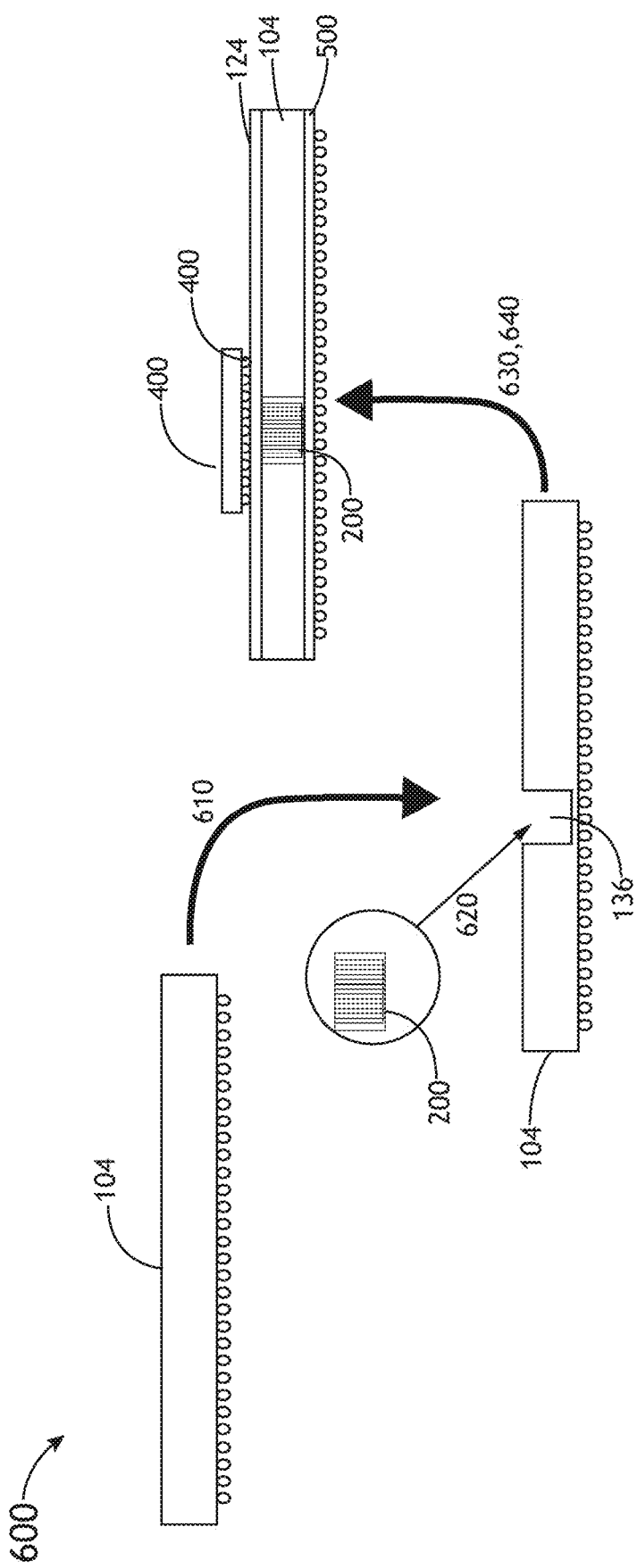
FIG. 6C is a diagram illustrating the method for forming the electronic assembly, in accordance with one or more embodiments of this disclosure.

In some embodiments, the method 600 includes a step 650 of attaching a second redistribution layer 500 to the primary die 104, wherein the first redistribution layer 124 and the second redistribution layer 500 are electrically coupled via the interconnect header 200. The attachment of the second redistribution layer 500 requires that the primary die cavity 136 extends through the bulk layer 108, the integrate circuitry layer, and the metal layer 120 creating a through-hole. The method 600, including step 650, is further depicted in FIG. 6C.

Figure 7A:
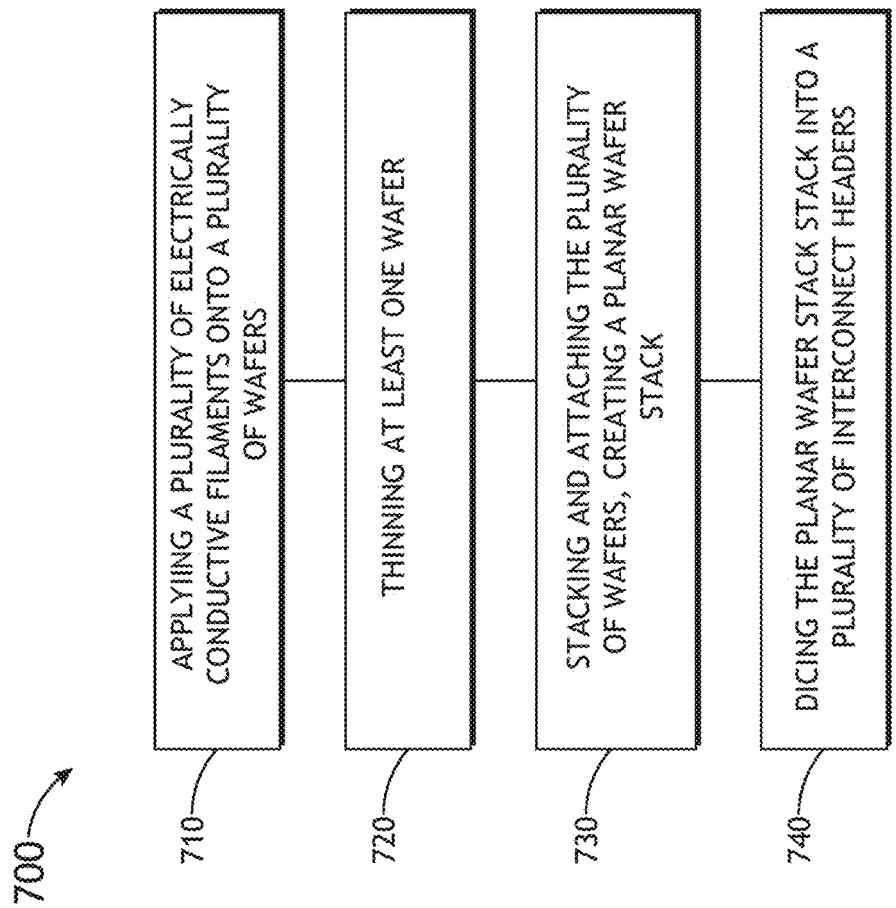
FIG. 7A is a block diagram illustrating a method for creating an interconnect header, in accordance with one or more embodiments of this disclosure.
Figure 7B:
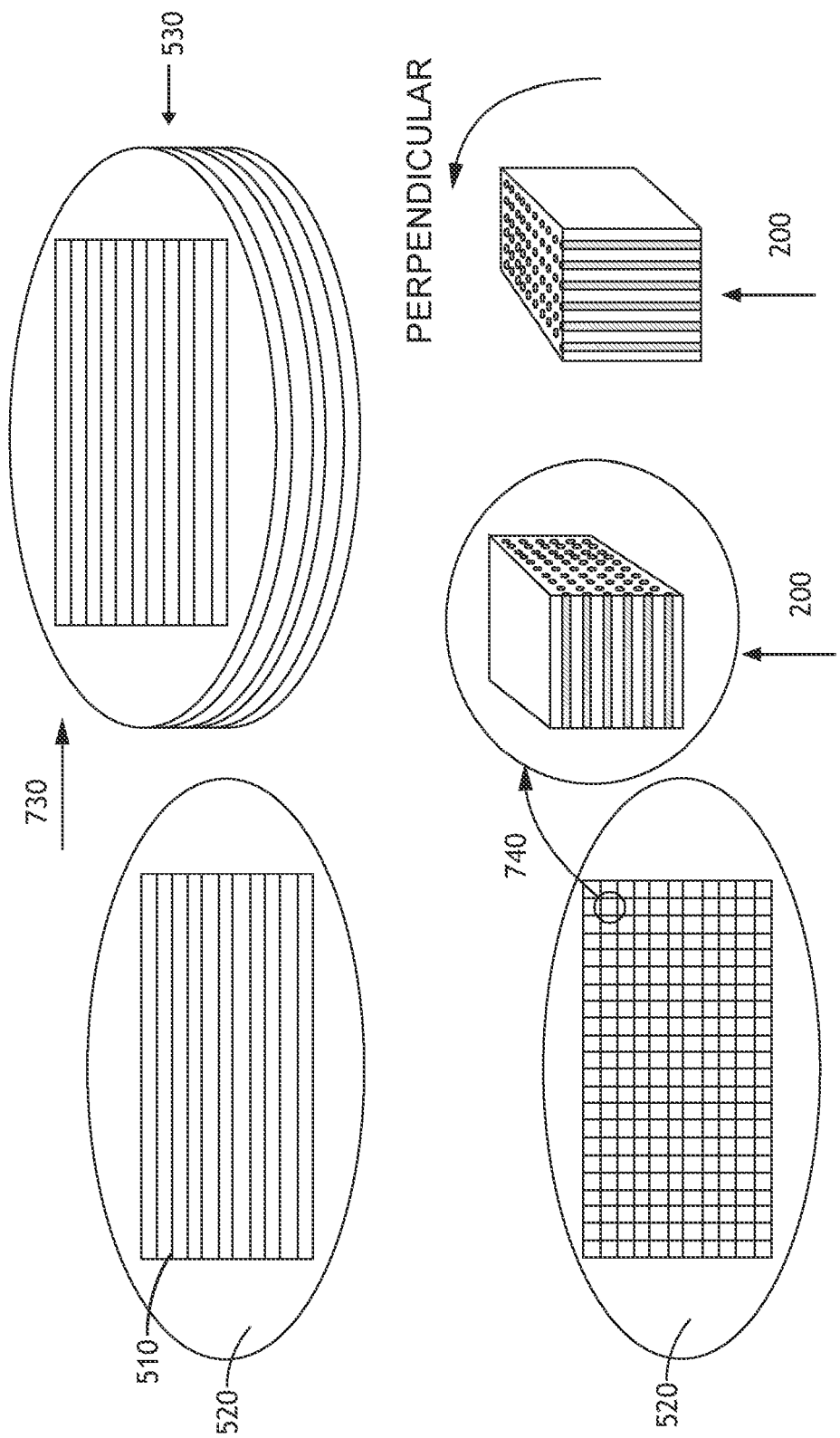
FIG. 7B is a diagram illustrating the process of fabrication as disclosed in the method, in accordance with one or more embodiments of this disclosure.

The interconnect header 200 may be fabricated via foundry-based methods and equipment. FIG. 7A is a flow chart illustrating a method 700 for creating an interconnect header 200, in accordance with one or more embodiments of this disclosure. The method 700 discloses a planar method of fabrication. FIG. 7B is a diagram illustrating the process of fabrication as disclosed in the method 700, in accordance with one or more embodiments of this disclosure.

In embodiments, the method 700 includes a step 710 of applying a plurality electrically conductive filaments 510 onto a plurality of wafers 520. The electronically conductive filaments 510, once processed, become the interconnect filaments 204 of the interconnect header 200. The electrically conductive filaments 510 may comprise any type of conductive material including but not limited to copper, silver, and gold. The electrically conductive filaments 510 may be organized into any pattern on the wafer 520. For example, the electrically conductive filaments may be arranged in as a set of parallel lines. The wafer 520 may be any type of material that may be used as a substrate for the electrically conductive filaments 510 including but not limited to a silicon wafer.

In some embodiments, the method 700 further includes a step 720 of thinning at least one wafer 520 of the plurality of wafers 520. For example, the at least one wafer 520 may be thinned on the backside (e.g., the side other than the side with the applied electrically conductive filaments 510). For instance, the backside of the at least one wafer 520 may be thinned to a thickness approximate to the thickness of the applied electrically conductive filaments 510.

In some embodiments, the method 700 further includes a step 730 of stacking and attaching the plurality of wafers 520, creating a planar wafer stack 530. For example, the wafers 520 may be stacked to a thickness of one dimension of the interconnect header 200. For instance, if an interconnect header 200 configured as a 10×20 array of interconnect filaments is planned, then 10 or 20 wafers 520 may be stacked. The wafers 520 may be bonded by any means. For example, the wafers 520 may be bonded via an adhesive. In another example, the wafers 520 may be bonded through heat and/or pressure. For example, the composition of the electrically conductive filaments 510 and the composition of the wafer 520 may permit wafer 520 bonding through pressure and/or heat.

In some embodiments, the method 700 further includes a step 740 of dicing the planar wafer stack 530 into a plurality of interconnect headers 200. For example, the planar wafer stack 530 may be diced according to the planned dimensions of the interconnect header 200. The planar wafer stack 530 may be diced via any method, including but not limited to sawing via a saw blade or cutting via a cutting wire. The diced wafer stack 530 thus yields interconnect headers 200 which are then placed in host die cavities 136 with orientation of the interconnect filaments 204 perpendicular to the redistribution layer 124 and host die metal layers 120.

In some embodiments, layers of conductive and/or non-conductive material may be sequentially added to a single wafer to produce the interconnect header 200 using standard wafer processes similar to those used in depositing alternating layers of metal and dielectric to a wafer. Therefore, the above description should not be interpreted as a limitation of the present disclosure, but merely as an illustration.

FIG. 8A is a flow chart illustrating a method 800 for creating an interconnect header 200, in accordance with one or more embodiments of this disclosure. The method 800 discloses a vertical method of fabrication. FIG. 8B is a diagram illustrating the process of fabrication as disclosed in the method 800, in accordance with one or more embodiments of this disclosure.

In embodiments, the method 800 includes a step 810 of embedding a plurality of electrically conductive vias 550 into a plurality of wafers 520 (e.g., the electrically conductive vias 550 appearing as individual dots on each wafer). The electronically conductive vias 550, once processed, become the interconnect filaments 204 of the interconnect header 200. The electrically conductive vias 550 may comprise any type of conductive material including but not limited to copper, silver, and gold. The electrically conductive vias 550 may be organized into any pattern on the wafer 520. For example, the electrically conductive vias 550 may be configured in a grid pattern arrangement. In another example, the electrically conductive vias may be configured in a star pattern arrangement. The electrically conductive vias 550 may be embedded into the wafer 520 via any means including but not limited to an etch-line-fill method.

In some embodiments, the method 800 further includes a step 820 of thinning at least one wafer 520. For example. The wafer 520 may be thinned on the backside (e.g., the side other than the side with the applied electrically conductive vias 550. For instance, the backside of the wafer 520 may be thinned so as to expose the embedded surface of the electrically conductive vias 550.

In some embodiments, the method 800 further includes a step 830 of stacking and attaching the plurality of wafers 520, creating a vertical wafer stack 560, with the individual electrically conductive vias 550 now forming the interconnect filaments 204. For example, the wafers 520 may be stacked to a length of the interconnect header 200. The wafers 520 may be bonded by any means. For example, the wafers 520 may be bonded via an adhesive. In another example, the wafers 520 may be bonded through heat and/or pressure. For example, the composition of the electrically conductive vias 550 and the composition of the wafer 520 may permit wafer 520 bonding through pressure and/or heat.

In some embodiments, the method 800 further includes a step 840 of dicing the vertical wafer stack 560 into a plurality of interconnect headers. For example, the vertical wafer stack 560 may be diced according to the planned dimensions of the interconnect header 200. The vertical wafer stack 560 may be diced via any method, including but not limited to sawing via a saw blade or cutting via a cutting wire.

The disclosed methods 700, 800 for generating interconnect headers 200 may be utilized within a typical semiconductor die foundry. TSVs are more difficult to generate than interconnect headers 200 and require special tooling/methods that may not be found in a typical semiconductor die foundry. For contracts that require the use of trusted semiconductor foundries, such as government/military contracts, methods 700, 800 may allow a trusted foundry that does not have TSV generating capabilities to produce the components that can replace TSVs like the interconnect header 200.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A system comprising:
an electronic assembly comprising:
a primary die comprising:
a bulk layer within which at least one bulk layer through-hole has been integrated;
an integrated circuitry layer disposed on a first side of the bulk layer, wherein the integrated circuitry layer comprises at least one integrated circuitry through-hole has been integrated configured to align with the at least one bulk layer through-hole;
at least one metal layer;
a first attachment layer;
first redistribution layer; and
a secondary die physically coupled to the primary die, comprising a second attachment layer configured to attach to the first redistribution layer; and
an interconnect header comprising a plurality of interconnect filaments configured to electrically couple the first redistribution layer to one of the at least one metal layer via the at least one bulk layer through-hole and the at least one integrated circuitry through-hole.

2. The system of claim 1 further comprising a second redistribution layer disposed between the metal layer and the first attachment layer, wherein metal layer comprises at least one metal layer through-hole configured to align with the at least one bulk layer through-hole and the at least one integrated circuitry through-hole, wherein the interconnect header is configured to electrically couple to the first redistribution layer and the second redistribution layer via the at least one bulk layer through-hole, the at least one integrated circuitry through-hole, and the at least one metal layer through hole.

3. The system of claim 1, wherein the interconnect filaments are configured as an array.

4. The system of claim 1, wherein the interconnect header is generated through the steps of:
applying a plurality of parallel electrically conductive filaments onto a plurality of wafers;
thinning at least one wafer of the plurality of wafers;
stacking and attaching the plurality of wafers, creating a planar wafer stack; and
dicing the planar wafer stack into a plurality of interconnect headers.

5. The system of claim 1, wherein the interconnect header is generated through the steps of:
applying a plurality of electrically conductive vias onto a plurality of wafers;
thinning at least one wafer of the plurality of wafers;
stacking and attaching the plurality of wafers, creating a vertical wafer stack; and
dicing the vertical wafer stack into a plurality of interconnect headers.

6. The system of claim 1, wherein at least one of the primary die or the secondary die is configured for flip chip mounting.

7. The system of claim 6, wherein at least one of the first attachment layer or the second attachment layer comprises at least one of solder balls, wire-bonding, or ball bumps.

8. The system of claim 1, wherein the interconnect header is attached on at least one end to the primary die via a thermal compression bond.

* * * * *